(12) United States Patent
Webster

(10) Patent No.: US 6,249,936 B1
(45) Date of Patent: Jun. 26, 2001

(54) WEDGELOCK INSTALLATION DEVICE

(75) Inventor: Matthew J. Webster, Preston (GB)

(73) Assignee: BAE Systems plc, Farnborough (GB)

( * ) Notice: Subject to any disclaimer, the term of this patent is extended or adjusted under 35 U.S.C. 154(b) by 0 days.

(21) Appl. No.: 09/422,971

(22) Filed: Oct. 22, 1999

Related U.S. Application Data

(63) Continuation of application No. PCT/GB99/02266, filed on Jul. 14, 1999.

(30) Foreign Application Priority Data

Jul. 16, 1999 (GB) .................................................. 9815339

(51) Int. Cl.⁷ .............................. A44B 21/00; B60R 9/00; B65H 59/00
(52) U.S. Cl. .................................. 24/569; 24/514; 24/525
(58) Field of Search .............................. 24/569, 514, 525, 24/535

(56) References Cited

U.S. PATENT DOCUMENTS

| 788,716 | * | 5/1905 | Hammond et al. ..................... 24/569 |
| 2,581,317 | * | 1/1952 | Zabich ................................... 24/569 |
| 4,101,061 | * | 7/1978 | Sage et al. ............................. 24/569 |
| 4,318,157 | | 3/1982 | Rank et al. . |
| 4,414,605 | | 11/1983 | Chino et al. . |
| 4,570,757 | * | 2/1986 | Marzullo ............................... 24/525 |
| 4,869,680 | | 9/1989 | Yamamoto et al. . |
| 4,914,552 | | 4/1990 | Kecmer . |
| 5,071,013 | * | 12/1991 | Peterson ................................ 24/525 |
| 5,074,012 | * | 12/1991 | Mitchell ................................ 24/569 |
| 5,540,686 | * | 7/1996 | Zippel et al. .......................... 606/56 |

* cited by examiner

Primary Examiner—Victor N. Sakran
(74) Attorney, Agent, or Firm—Nixon & Vanderhye

(57) ABSTRACT

A device for fixedly securing and releasing items located between counter members and against an abutting member, the device being capable of securing such items to or releasing such items from an end connector and actuating a wedgelock assembly through a single operation.

10 Claims, 3 Drawing Sheets

(1)

(2)

(3)

WEDGELOCK INSTALLATION DEVICE

This is a continuation of PCT application PTC/GB99/02266, filed Jul. 14, 1999, the entire content of which is hereby incorporated by reference in this application.

BACKGROUND OF THE INVENTION

1. Field of the Invention

This invention relates to securing devices for retaining items in position between two counter members, an example of which would be the retention of printed circuit boards in an elongated slot within a computing equipment rack.

2. Discussion of Prior Art

Devices such as printed circuit boards (PCB's) need to be held rigidly in place if they are to function properly. Any severe movements can cause connections to the board to be broken which will result in the board, and any systems that depend on it, to either function incorrectly or cease their operation entirely. When such boards are used in environments which are hostile to their prolonged operation, for example in applications which involve sudden movements and accelerations, it is necessary to take measures to ensure that the boards are fixed firmly relative to the surrounding structure. A common method of fixing such boards in place involves the use of wedgelock devices.

A wedgelock securing device is used to secure equipment such as printed circuit boards in racks which comprise parallel counter members. Such securing devices comprise a centre wedge having sloped surfaces at its opposite ends and two end wedges each having one sloped surface that abuts one of the centre wedges sloped surfaces. The centre wedge is usually adapted so that it may be fasten to a printed circuit board.

A screw extends lengthwise through the centre wedge and connects together the two end wedges. The end wedge remote from the screw head has a threaded bore engaged by the screw such that a clockwise rotation of the screw draws the two end wedges towards each other. As the sloped surfaces of the two end wedges bear upon the sloped surfaces of the centre wedge the end wedges are caused to deflect transversely. This increases the effective width of the wedgelock assembly. As this effective width increases to that of the retaining channel, the wedgelock fastens itself in the slot. Continued clockwise rotation of the screw will tighten the device further. The wedgelock can be released by rotating the screw in an anti-clockwise direction, thereby causing the two end wedges to move apart longitudinally and hence reduce the assembly's effective width. This in turn releases the clamping force of the wedgelock assembly within the slot thereby allowing the PCB to be removed from the rack.

It is also known to provide end connectors that secure PCB's to fixed members for increased rigidity. Such connectors comprise two inter-connecting sections which are joined by a screw. One of these sections is attached firmly to the PCB and includes a bore in which the screw is located. The other section is permanently rigidly attached to a structural element so that the PCB is held firmly in place. This permanently fixed section includes a threaded bore that engages the connecting screw. When the two sections are aligned with each other the screw may be rotated clockwise causing the two sections to be drawn together by the action of the screw head bearing upon the section that is connected to the circuit board. As the screw is rotated clockwise the two sections close together and are eventually held rigidly in place to the structural element. These end connectors allow for increased rigidity which is imperative if the PCB is to remain in place and continue to function as intended.

Certain conditions have been known that require both of the two securing methods described above, namely the wedgelock device and the printed circuit board end connector, to be used contemporaneously to secure a single PCB. Such configurations are more difficult to assemble and hence fewer PCB's may be fixed in place in a given period than if only one of the described methods were to be used. This increased installation time is a result of the fact that a PCB, which is to be fixed in place using an end connector, must be fully secured to the connector before any wedgelock devices an be installed. The present invention offers a solution to the problems associated with performing multiple assembly operations involving wedgelock devices and end connectors for printed circuit board installations.

SUMMARY OF THE INVENTION

According of the present invention there is provided a device for fixedly securing and releasing items located between counter members and against an abutting member, the device being capable of securing such items to or releasing such items from an end connector and actuating a wedgelock assembly through a single operation.

This overcomes the problems of the prior art as the assembly process requires a single operation to secure the item in place to an end connector and through the use of a wedgelock, rather than the two distinct processes that are characterized in methods currently in use.

A further aspect of the invention is that there is provided a device wherein the wedgelock central spindle is adapted, to include a left handed thread and the provision of a clutch mechanism which may comprise a hex drive arrangement, to allow securing of the said items to or releasing the said items from the end connector and actuation of the wedgelock through the use of means attached to the said spindle.

This overcomes the problems existing in the current methods as it provides the means to secure items with the properties described in one operation, by modifying the existing apparatus using common techniques.

BRIEF DESCRIPTION OF THE DRAWINGS

A specific embodiment of the invention will now be described by way of example with reference to the accompanying drawing in which.

DETAILED DISCUSSION OF PREFERRED EMBODIMENTS

Figure 1:
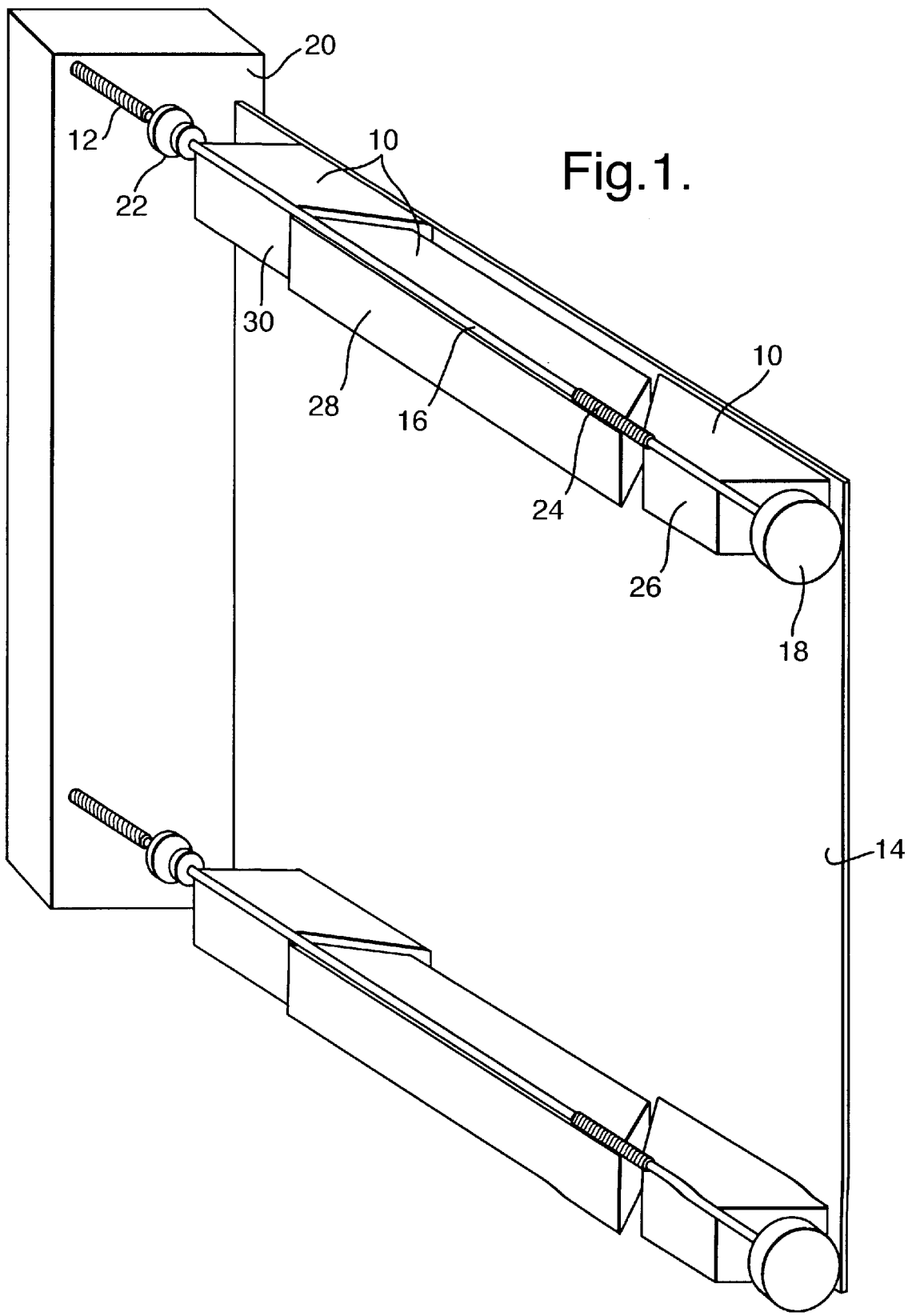
FIG. 1 shows a pictorial view of the device in position on a PCB installation.

FIG. 1 shows a pictorial view of two combined end connector and wedgelock devices in use with a PCB 14. The wedge lock assembly 10 comprises three sections; the remote section 30, the centre wedge 28 and the threaded section 26. The centre wedge 28 is shown attached to the PCB 14 and the connector assembly 20 is shown fixed to the PCB 14 by a jack screw 12. The clutch assembly 22 is connected to the remote end of spindle 16 and is rotated using the hand knob 18 which is attached to the opposite end of spindle 16 to the clutch 22.

Figure 2:
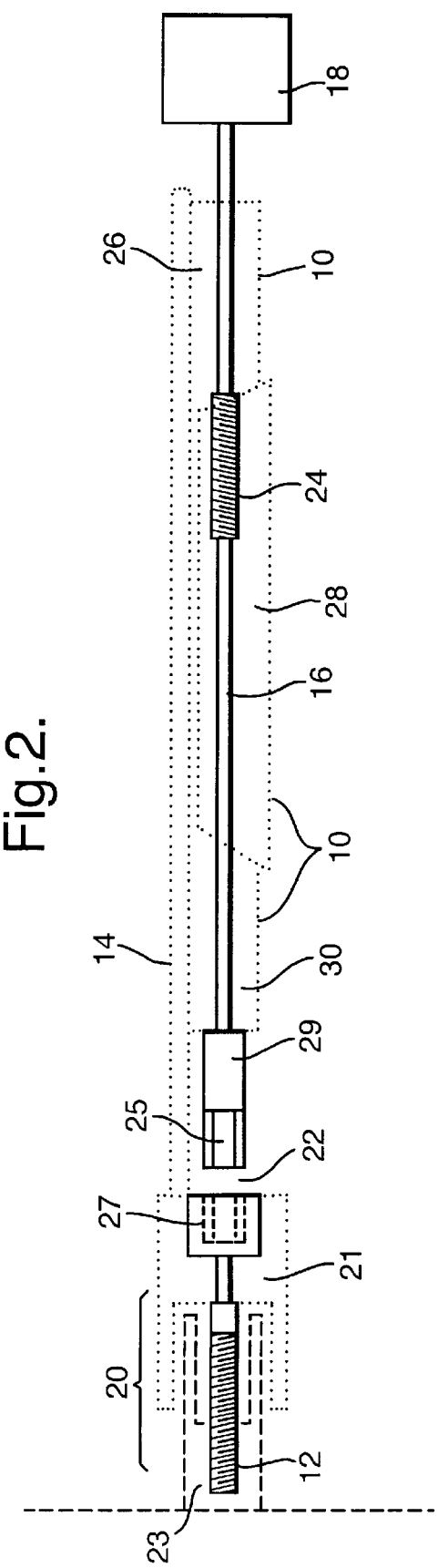
FIG. 2 shows a plan view of the device with the jack screw in its final position and the wedgelock expanding.

FIG. 2 shows the connector assembly in greater detail comprising two interconnecting sections, namely the PCB connector 21 and the internally threaded connector mating section for receiving the jack screw 12. The clutch assembly 22 comprises a driver part 25 and a driven part 27. The spindle 16 has a left hand threaded portion 24 along part of its length and joins the hand knob to the clutch driver 25, passing through the wedge lock assembly 10. The connector assembly 20 is shown mated and the wedge lock assembly 10 in an expanding state.

Figure 3:
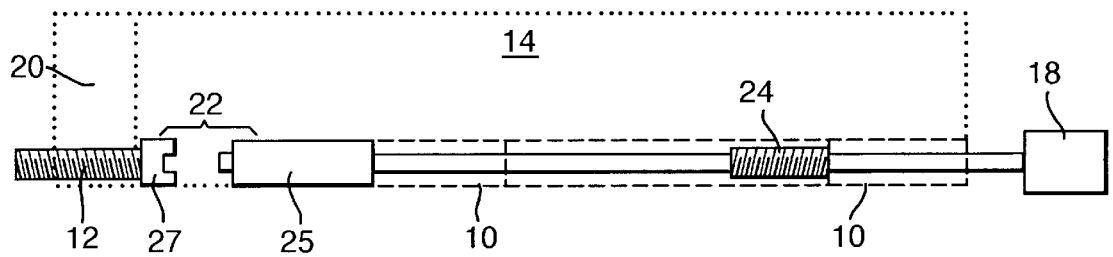
FIGS. 3(1), 3(2) and 3(3) show the assembly in diagrammatic form (1) initially, (2) with the jack screw in use and (3) with the wedgelock being operated.
Figure 3:
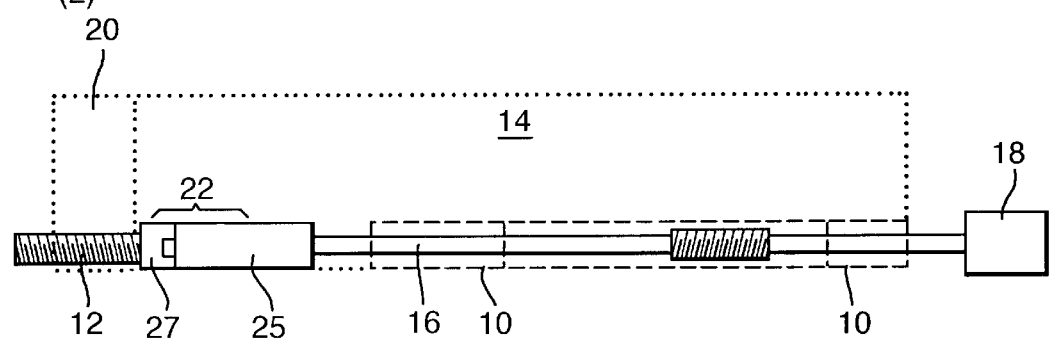
Figure 3:
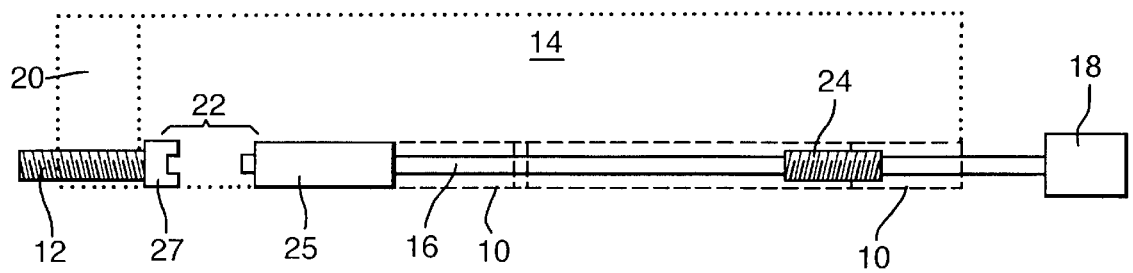

FIG. 3 shows the device, in diagrammatic form, at various stages of the assembly operation namely (1) prior to connection, (2) whilst securing PCB 14 using the connector assembly 20 and (3) whilst securing PCB 14 using the wedge lock assembly 10.

In one embodiment of the invention a PCB 14 is firstly secured to a connector 20 by utilising a jack screw 12 and then secured against guide ribs (not shown) by utilising a wedgelock device. The jack screw 12 joins the two halves 21 and 23 of the connector 20 by engaging into a threaded bore in portion 23 of the connector 20. When the jack screw 12 is rotated clockwise the two sections 21 and 23 of connector 20 will be mated, thereby securing PCB 14 at the connector 20 edge. The clockwise rotation which results in the jack screw 12 being tightened is transmitted through to the clutch assembly 22. This movement is transmitted by the central spindle 16 which joins the clutch driver 25 to knob 18. When the clutch driver 25 is fully engaged with the driven part 27 of the clutch assembly 22, knob 18 is rotated clockwise resulting in the rotation of the spindle 16, clutch assembly 22 and the jack screw 12, thereby leading to the mating of the two halves 21 and 23 of the connector 20. Once the jack screw 12 is fully engaged, knob 18 is pulled in a direction away from the connector 20, thereby disengaging the clutch assembly 22 which may comprise a hex drive or other means.

A portion of the central spindle 16 comprises an external left handed thread 24 which engages with a threaded section 26 of the wedge lock assembly 10 when knob 18 is pulled sufficiently far in a direction away from the connector 20. Knob 18 is rotated in a clockwise direction once the threaded sections 24 and 26 have engaged with one another. This rotation will cause the spindle 16 to rotate, therein allowing the left hand threaded section 24 to be drawn into the threaded wedgelock section 26. This action will cause the block 29, which is rigidly attached to the central spindle 16, to bear upon the remote section of the wedgelock 30, thereby causing the centre section 28 of the wedgelock 10 to deflect transversely. This increases the effective width of the wedgelock 10 and secures the PCB 14 in place against guide ribs (not shown).

To remove he PCB 14 the steps described above are carried out in the reverse order.

What is claimed is:

1. A device for fixedly securing and releasing an item located between counter members and against an abutting member, the device capable of releasably securing said item to an end connector and actuating said wedgelock assembly through a single rotational operation, said device comprising a wedgelock central spindle adapted to releasably secure said item to said end connector and actuation of a wedgelock, the wedgelock assembly being actuated through rotational operation of said central spindle.

2. A device as in claim 1 wherein a left handed thread is provided to actuate the wedgelock.

3. A device as in claim 1, wherein a clutch mechanism is provided to transmit rotational motion to the securing means of the end connector.

4. A device as in claim 3 wherein the clutch mechanism comprises a hex drive arrangement.

5. A wedgelock device for releasably securing a printed circuit board to a connector and a rack, said printed circuit board having a rotatable threaded portion, said connector including a threaded portion which, when said board is secured to said connector and rack, is threadably engaged with said circuit board threaded portion, said rack including at least two spaced apart parallel counter members, said wedgelock device comprising:

a wedgelock assembly comprised of at least two end wedges and at least one center wedge disposed between said at least two end wedges, wherein one of said at least two end wedges and at least one center wedge is secured to said printed circuit board against movement perpendicular to said board, and the other of said at least two end wedges and at least one center wedge is moveable in a direction perpendicular to said board, whereby said end and center wedges are adapted to slidably fit between said counter members unless said at least two end wedges compress said at least one center wedge, and a wedgelock central spindle, extending through said at least two end wedges and at least one center wedge and moveable between extended and retracted positions, said central spindle including a clutch portion at one end and a threaded portion on an end away from said clutch portion, said spindle in an extended position has said clutch portion engageable with and for rotating said printed circuit board rotatable threaded portion into and out of said engagement with said connector threaded portion, said clutch portion out of engagement with said printed circuit threaded portion when said spindle is in a retracted position, said central spindle including a threaded portion cooperable with a threaded portion of at least one of said at least two end wedges and at least one center wedge so as to force said at least one center wedge into frictional engagement with at least one of said counter members.

6. The wedgelock device according to claim 5, wherein said wedgelock device includes only two end wedges and only one center wedge.

7. The wedgelock device according to claim 6, wherein said clutch portion includes an abutment limiting retraction of said spindle into one of said end wedges and said spindle threaded portion is rotatably threadably engageable with the other of said end wedges and adapted such that rotation of said spindle when in said retracted position pulls said abutment and said one end wedge towards said other end wedge thereby compressing said center wedge and biasing it into frictional engagement with said counter members.

8. The wedgelock device according to claim 5, wherein said rotatable threaded portion comprises a connecting screw and said connector threaded portion comprising a threaded bore.

9. The wedgelock device according to claim 8, wherein said threaded portion of at least one of said at least two end wedges and at least one center wedge comprises left hand threads in said end wedge away from said clutch portion, said connecting screw has right hand threads and said spindle threaded portion and said threaded portion of end wedge have complementary left hand threads.

10. The wedgelock device according to claim 5, wherein said center wedge is fixed with respect to the printed circuit board.

* * * * *